United States Patent [19]

Lampert et al.

[11] Patent Number: 5,181,985
[45] Date of Patent: Jan. 26, 1993

[54] PROCESS FOR THE WET-CHEMICAL SURFACE TREATMENT OF SEMICONDUCTOR WAFERS

[75] Inventors: Ingolf Lampert, Burghausen; Christa Gratzl, Neuotting, both of Fed. Rep. of Germany

[73] Assignee: Wacker-Chemitronic Gesellschaft fur Elektronik-Grundstoffe mbH, Burghausen, Fed. Rep. of Germany

[21] Appl. No.: 666,493

[22] Filed: Mar. 6, 1991

Related U.S. Application Data

[63] Continuation of Ser. No. 359,508, Jun. 1, 1989, abandoned.

[30] Foreign Application Priority Data

Jun. 1, 1988 [DE] Fed. Rep. of Germany ....... 3818714

[51] Int. Cl.$^5$ .................. H01L 21/306; B44C 1/22; C03C 15/00
[52] U.S. Cl. .................. 156/635; 156/640; 156/662; 134/11; 134/28; 134/31
[58] Field of Search ............ 156/635, 640, 662; 427/255.1; 134/11, 28, 31

[56] References Cited

U.S. PATENT DOCUMENTS

| | | | |
|---|---|---|---|
| 708,052 | 9/1902 | Kitsee | 156/635 |
| 2,948,642 | 5/1959 | MacDonald | 156/662 |
| 4,176,206 | 11/1979 | Inoue | 427/435 |
| 4,749,440 | 6/1988 | Blackwood et al. | 156/662 |
| 4,749,640 | 6/1988 | Tremont | 437/946 |

FOREIGN PATENT DOCUMENTS 2-205025 10/1990 Japan.

OTHER PUBLICATIONS

*Grant & Hackh's Chemical Dictionary*, 5th edition, 1987, McGraw-Hill, pp. 145, 242, 373.
*Fundamentals of Classical Thermodynamics*, 3rd edition, Van Wylen & Sonntag, 1985, John Wiley & Sons, p. 38.
*Hackh's Chemical Dictionary*, Fourth edition, McGraw-Hill, 1972, p. 636.
*Tabellenbuch Chemie, VED Deutscher Verlag der Grundstoffindustrie*, 9. ed., pp. 164–165.

*Primary Examiner*—W. Gary Jones
*Assistant Examiner*—Todd J. Burns
*Attorney, Agent, or Firm*—Collard & Roe

[57] ABSTRACT

A process for the wet-chemical surface treatment of semiconductor wafers in which aqueous phases containing one or more chemically active substances in solution act on the wafer surfaces, consisting of spraying a water mist over the wafer surfaces and then introducing chemically active substances in the gaseous state so that these gaseous substances combine with the water mist so that there is an interaction of the gas phase and the liquid phase taking place on the surface of the semiconductor wafer. Gases such as hydrogen fluoride, chlorine and ozonized oxygen or other halogen gases act on the wafer surfaces between rinsing steps so that when the wafers are dried, the surfaces achieve extremely high cleanliness levels.

18 Claims, No Drawings

PROCESS FOR THE WET-CHEMICAL SURFACE TREATMENT OF SEMICONDUCTOR WAFERS

This is a continuation of copending application Ser. No. 07/359,508 filed on Jun. 1, 1989 now abandoned.

BACKGROUND OF THE INVENTION

This invention relates to a process for the wet-surface treatment of semiconductor wafers, in which aqueous phases containing one or more chemically active substances in solution are caused to act on the surfaces.

The constantly increasing miniaturization in the production of electronic components has resulted in increased requirements imposed on the surface quality of semiconductor wafers made from materials such as silicon, gallium arsenide and indium phosphide. These requirements apply not only to the geometrical quality of the wafer surfaces, but also to their cleanliness, chemical finish and freedom from particle contamination.

In order to control these parameters cleaning processes were developed wherein, after a polishing operation which guarantees the geometrical perfection of the semiconductor surfaces, a sequence of treatment steps is carried out in which various aqueous agents act on the wafer surfaces. Most of these processes originate essentially from a cleaning process which was specified by W. Kern and D. A. Puotinen in RCA Reviews 31, 187 (1970) and which comprises a sequence of rinsing, hydrophilizing and hydrophobizing steps. Generally, aqueous solutions of ammonia, hydrogen chloride, and hydrogen fluoride are used as agents, and hydrogen peroxide is used as an oxidizing component.

It is also essential that the solutions used fulfil the strictest purity requirements, with regard to the proportion of foreign ions or the freedom from particles contamination. Thus, at great expense, the solutions are free, as much as possible, from particle contamination even during their production by filtration operations. They are then transported in special containers and then poured into cleaning baths or spraying systems, or into upstream reservoirs, with special precautions being taken. Additional filtration devices may be provided in the existing inlet or outlet pipes.

However, these steps have the disadvantage in that, on the one hand, the finished solutions may have to be transported in large quantities over long distances, adding to the expense and the risk of contamination. Moreover, where a multiplicity of consecutive treatment steps involves various solutions, a correspondingly large number of immersion baths has to be provided. The composition of these baths is subject to variations due to their chemical reaction with the substrates and/or the volatility of chemically active substances. In conventional spray cleaning processes, it is necessary to keep extensive stocks of chemicals for the various solutions. In addition, the residues of the preceding treatment step, in particular in the inlet pipes, have to be removed using elaborate intermediate washing steps before the subsequent step can be initiated.

SUMMARY OF THE INVENTION

It is an object of the present invention to provide a process that overcomes the problems encountered in the preparation of particle-free solutions. It is another object of the invention to provide a process for treating the surface of semiconductor wafers that is simple, effective and can be performed quickly.

Accordingly, the present invention provides a process wherein chemically active substances are introduced in the gaseous state, and water is provided in a finely divided liquid state such as a mist, into a system containing the semiconductor wafers to be treated, and the phases acting on the semiconductor surfaces in the system are generated by the interaction of the chemically active gases and the liquid phase or water mist.

The possibility of using wet-chemical processes of this type to clean wafers using gases has been mentioned in general in Abstract No. 640 of the Extended Abstracts ECS Fall Meeting, Oct. 18-23, 1987, page 900, New Solutions for Automatic Wet Processing, by Chris McConnell. However, this document provides no specific information for performing such processes, but refers to the research efforts which are still necessary.

The water used in the process according to the invention is the highest purity possible in order to prevent contamination of the wafer surface. Water of adequate purity can, for example, be obtained in a known manner by means of reverse osmosis, ultrafiltration, or ion exchange. It is used in the usual cleaning processes, for example, for intermediate rinsing steps. Important characteristic parameters for assessing the quality of water used in the production of electronic components are freedom from ions, particles and bacteria and also the content of organically bound carbon. In general, the purity requirements of the water used are, in each case, are defined based upon the cleanliness requirements imposed on the wafers treated. In many cases, however, the tendency is to use substances of the maximum possible purity in each case.

The water temperature may be varied within a wide range and is, in general, between 10° and 90° C. In some cases, the water may be used without additional cooling or heating, i.e. at temperatures from about 15° to 25° C. Usually, however, the water is kept at temperatures between 35° to 75° C., by using a thermostat, since shorter treatment times can then be achieved.

The water is introduced into the system containing the wafers to be cleaned in the form of a mist. The water can, for example, be sprayed in, fed in through nozzles or aerosolized. Nozzle systems used in conventional spray etching or spray cleaning processes are suitable for applying agents to the semiconductor wafers to be treated. Advantageously, droplet size, jet direction and jet force are matched to each other so that, at least in the region in which the semiconductor wafers are provided, a uniform aerosol-like water mist is built up. Thus, a uniform treatment of the wafer surface is guaranteed.

Suitable gaseously supplied chemically active substances are those which can interact with the finely divided water to form phases which are active on the wafer surface. Preferred examples of such gases are ammonia, hydrogen chloride, hydrogen fluoride, ozone or ozonized oxygen. At the same time, these gases may be used either in pure form, or added to carrier gases such as, for example, nitrogen, argon or, in some cases, also hydrogen. However, the possibility that there may be a reaction to the carrier gas has to be taken into account. Air may, in principle, also be used as carrier gas provided the required purity and freedom from particle contamination is ensured by a suitable treatment.

Ammonia gas, hydrogen chloride gas and hydrogen fluoride gas are commercially available in adequate chemical purity in conventional pressurized steel cylinders, and can be freed from entrained particles by filters interposed in the gas stream. The filters used may be, membrane filters made of inert materials, such as plastics, i.e. polytetrafluoroethylene, and have suitably selected pore sizes. In general, these gases, usually present in the cylinders in liquified form, are notable for a high purity since many contaminants remain in the liquid phase and consequently within the gas cylinder. Sometimes, suitable gases are also produced in other processes in adequate chemical purity as exhaust gases or byproducts, and can therefore be made use of. An example of this is hydrogen chloride which is produced in the production of silicon by decomposing trichlorosilane, and which is notable for its extremely low proportion of foreign ions. This byproduct gas is therefore particularly satisfactory for applications in which the highest purity is of importance. In general, the number of particles in the gases used can be reduced at relatively low expense compared with liquids, to values which comply even with the strictest clean room requirements in the production of electronic components. For example, clean-room category 10 means that the number of particles having a size exceeding 0.3 $\mu$m per cubic foot of the atmosphere does not exceed 10. The number of particles in the gas streams may be monitored, for example, by means of counters which are based, for example, on the principle of measuring scattered light.

An oxidizing gas which is used with particular advantage and whose action is comparable with that of hydrogen peroxide in conventional processes is ozone, or ozonized oxygen. In this connection, an ozone content of 0.5 to 15% by volume, based on the total gas stream, is, in most cases, adequate. However, the use of gas streams containing higher or lower percentages of ozone are not impossible. Ozone-containing oxygen can be easily produced using ozonizers, or other commercial devices which convert oxygen partially into ozone. For example, ozone is produced in these devices under the influence of electrical glow discharges. Devices of this type usually produce ozone of up to about 15% by volume, based upon the oxygen used. Higher ozone contents of between typically 20 to 30% by volume can also be achieved with some electrolysis devices equipped with special electrodes. Within the scope of the invention, ozone-containing gases may either be used on their own, or at the same time, as one or more of the other chemically active gaseous substances mentioned. However, it is important to take into consideration redox reactions which may occur between the individual components, such as between ozone and ammonia. These reactions may compete with the reactions with the wafer surface.

Halogens such as chlorine and bromine as oxidizing gases may also be used, and similar to the gases mentioned, are easily accessible and available in high purity, and become chemically active on the wafer surface when interacting with water.

Reaction chambers are used to permit water, gaseous, chemically active substances, and the surface of the semiconductor wafers to interact with each other. When reaction chambers are used, an individual semiconductor wafer, or a plurality of semiconductor wafers can be introduced into a working position. It is then possible to control the supply of finely divided water and gaseous, chemically active substances and their uniform action on the wafer surfaces. The liquids produced in the process can also be collected and removed.

The wafers can also be easily removed after treatment, and, if necessary, a further batch can be introduced. Facilities may also be provided to agitate the wafers in the working position, for example by rotation. Suitable reaction chambers may be designed similar to conventional spray etching or spray cleaning chambers. Suitable devices to supply the various gases and the water may be advantageously provided, instead of the introduction facilities for the various solutions. In principle, it is, also possible to operate mixed systems which have both the facility for introducing gases and also solutions. For example, a mixed system can be used where certain mixtures are employed which cannot be produced, or can only be produced with difficulty, in a gaseous phase, such as, for example, hydrogen peroxide/ammonia or hydrogen peroxide/hydrogen chloride solutions.

Advantageously, the aqueous phases produced are removed as quickly as possible from the system after they have acted on the wafer surface in order not to upset the balance established between the solid, liquid and gas phases, and to aid in the removal of contaminants which have been collected in the process. This process has in most cases proved more beneficial than collecting the used liquids in the system and removing them in batches, although this variant is also not excluded.

The concentrations of the chemically active gaseous substances in conjunction with the water mist that reacts on the wafer surface can be controlled depending upon the quantitative or volumetric proportions required by adjusting the flow of the components into the system per unit time. The optimum values are determined from preliminary experiments. As a guide line, use may be made of the concentration values which are determined from conventional liquid-only processes for the corresponding solutions. From these concentrations, the quantitative ratios, and the required flow rates for components of the system can be derived, in each case, to a first approximation. For example, in the case where about 10% by weight hydrochloric acid solution is used, the quantities of hydrogen chloride gas and of finely divided water supplied to the system per unit time can be adjusted to a ratio by weight of about 1:9. On the basis of these values, one can then fine tune the system if necessary.

The process according to the invention can be used to provide cleaning processes, wherein the surface of polished, semiconductor wafers is wet-chemically treated to remove the residual contaminating particles, and particular surface properties can be established in a simple manner.

A possible sequence of process steps wherein the surfaces of semiconductor wafers are first freed from any polishing residues and are finally converted to a hydrophilic state, may, for example, proceed as follows:

First the wafers are placed in a processing tray and inserted into the system. A converted spray etching chamber can, for example be used in which a continuous water mist is produced by means of a plurality of nozzles. Hydrogen fluoride gas is then injected into the system for a short time, and hydrofluoric acid is formed. This strips any oxide layer formed, together with the contaminants contained therein from the wafer surface. After the HF gas is stopped, and while continuing to spray in water, the wafers are washed until acid-free. Then an ozonized oxygen stream is introduced for a short time to cause the formation of a superficial oxide layer. The wafers are then washed in the additive-free water mist. The oxide layer is stripped off by again introducing HF gas into the system. A hydrophilic wafer surface is then produced after a further washing step, by introducing ozonized oxygen and hydrogen chloride gas. The last residues of the chemically active substances are finally removed from the system by a washing step. The wafers may then be removed for drying or, may be dried in the system, using for example, a stream of nitrogen or argon, and if necessary, at elevated temperatures. It is obvious that this process is not to be regarded as a limitation of the invention but is intended to disclose, by way of example, one of the many possible embodiments.

The process, according to the invention, has the advantage of eliminating contaminating particles from acting on the wafers due to the highly developed gas purification techniques. Moreover, since the chemically active substances are provided in gaseous form, costs are reduced since large stocks of liquid chemicals are not needed. Furthermore, systems of this type are easy to control and may be automated, for example, by incorporating computer-controlled gas solenoid valves. Furthermore, the processes are easy to modify, and are easily adjusted for various requirements. For example, hydrophobic rather than hydrophilic wafer surfaces, can be produced since large quantities of liquid solutions do not have to be prepared. Moreover, because of the high efficiency of the process of the invention, it is possible to reduce the chemical requirements, and the quantity of used chemicals which have to be disposed of.

The process is suitable particularly for the wet-chemical treatment of elementary semiconductors such as germanium and, preferably, silicon. It may, however, also be used in semiconductors compounds such as gallium arsenide, gallium phosphide, indium phosphide or cadmium telluride.

The invention is explained in more detail in the following exemplary embodiment:

EXAMPLE

A cleaning process was carried out on polished silicon wafers in a conventional spray cleaning chamber which had been converted to receive chemically active gases.

For this purpose, the chamber was provided with gas connections for supplying hydrogen fluoride gas, hydrogen chloride gas, ozonized oxygen and argon instead of having facilities to introduce various solutions. The individual gases were provided in steel cylinders and were adjusted to their working pressure by means of pressure reduction valves. It was possible to inject the gases into the chamber system at certain flow rates via controllable regulating valves. The oxygen gas was passed through a commercial ozonizer where it was enriched by approx. 8% by volume of ozone.

Furthermore, it was possible to spray water into the chamber using a nozzle system that provided a homogeneous, aerosol-like spray mist in the interior space. The water used was freed from foreign ions by reverse osmosis, and from particles by ultrafiltration, and complied to the purity standard usual in semiconductor technology for wet-chemical cleaning processes employing solutions.

A polytetrafluoroethylene membrane filter having a pore size of approx. 0.2 $\mu$m was interposed in each of the gas streams before it entered the actual cleaning chamber. Random-sample type examinations by means of particle counters revealed that the gas streams complied with the requirements of clean-room category 10 after the filtration, i.e. they contained a maximum of 10 particles exceeding 0.3 $\mu$m particle size per cubic foot.

A process tray loaded with approx. 25 polished silicon wafers (diameter approx. 10 cm) was then placed on the rotating dish located in the system and rotated along the longitudinal axis of the spray chamber. At the same time, water was sprayed in and the wafers were quickly surrounded by a dense water mist. The temperature of the water was approx. 60° C. After about 20 seconds, the valve for the hydrogen fluoride gas was opened and HF gas was introduced. The flow rate of the HF gas and that of the water were matched to each other so that the quantities of both substances present in the system per unit time corresponded to approx. 0.5% by weight of hydrofluoric acid. After about 60 sec., the gas stream was interrupted, and for approx. 100 sec., only water was sprayed onto the wafers. Then, while continuing to supply water, hydrogen chloride gas (approx. 5% by weight, based on water) and ozonized oxygen (approx. 1 liter of gas mixture per liter of water) were introduced for approx. 120 sec. into the treatment chamber. This was followed by a rinsing step lasting 180 sec. and employed pure water without added gas. Hydrogen fluoride gas was again introduced for approx. 60 sec., and specifically, at the flow rate used previously. (Such a procedure is not specified as mandatory; different flow rates may be used in each case.) The wafers were then rinsed again with water for only about 100 sec., and finally, ozonized oxygen was additionally introduced for a further 60 sec., and specifically, again in a manner such that about 1 liter of gas mixture was fed in per liter of water. Finally, both the gas stream and the water stream were cut off, and the wafers were spin-dried, the drying operation being aided by a stream of argon.

The hydrophilic silicon wafers obtained were removed and examined for surface contaminants with the aid of the so-called VPD/AAS analysis method. This method of examination is described in "Chemical Analysis of Ultratrace Impurities in $SiO_2$ Films" by A. Shimazaki et al., Extended Abstracts of the 16th Conference on Solid State Devices and Materials, Kobe 1984, pages 281-284. Using this method, the slightest quantities of contamination can be detected. The examination yielded the following average result (specified in each case in atoms/$cm^2$):

Iron: less than $7.0 \times 10^{10}$,
Chromium: less than $7.5 \times 10^{10}$,
Alumi: $5.4 \times 10^{11}$,
Zinc: $1.4 \times 10^{11}$.

These values were consequently equivalent to the best cleanliness levels achievable with the conventional bath or spray cleaning processes carried out with aqueous solutions.

While only a single embodiment has been described, it will be obvious that many other changes and modifications may be made therein without departing from the spirit and scope of the invention.

What is claimed is:

1. A process for wet-chemical surface post-polishing cleaning of semiconductor wafers in a system where aqueous phases containing one or more chemically active substances having a gaseous state in solution chemically act on the surfaces of the said wafers comprising the steps of:

initially treating the water and the chemically active gaseous substances to reduce the quantity of contamination particles;

introducing an effective amount of the chemically active substances in the gaseous state into the system; said chemically active substances are selected from the group consisting of the gases of ammonia, hydrogen chloride, hydrogen fluoride, ozone, ozonized oxygen, chlorine and bromine;

introducing water at a temperature of 10° C. to 90° C. in the form of a mist into the system containing the semiconductor wafers;

producing said mist by spraying water, feeding water through nozzles or aerosolizing water;

forming the liquid phases chemically acting on the wafer surfaces within the system by the interaction of the gas phase and the mist; and exposing said wafer surfaces to said chemically acting liquid phases.

2. The process as claimed in claim 1, wherein silicon wafers are used as semiconductor wafers to be treated.

3. The process as claimed in claim 1, wherein a continuous stream of finely divided water in the form of a mist and a sequence of chemically active gaseous substances are introduced into the system.

4. The process as claimed in claim 3, wherein the sequence is adjusted so that water acts on the semi-conductor wafers to be treated between the periodic introduction of the chemically gaseous active substances.

5. The process as claimed in claim 1 comprising the step of rotating the semiconductor wafers during the introducing steps.

6. The process as claimed in claim 1, wherein the water is adjusted to a temperature between 35° C. to 75° C.

7. The process as claimed in claim 1, wherein the water is adjusted to a temperature between 15° C. to 25° C.

8. A process for wet-chemical surface post-polishing cleaning of semiconductor wafers contained in a closed treatment chamber utilizing water and chemically active gaseous substances, in which chemically active substances comprising hydrogen fluoride, hydrogen chloride, and ozonized oxygen chemically act on said surface of said wafers comprising the steps of:

initially treating the water and the chemically active gaseous substances to reduce the quantity of contamination particles;

spraying a water mist at a temperature of 10° C. to 90° C. within the chamber onto the surface of the semiconductor wafers to be treated;

producing said mist by spraying water, feeding water through nozzles or aerosolizing water;

subsequently introducing an effective amount of hydrogen fluoride gas into the chamber containing the water mist to form hydrofluoric acid on the surface of the wafers;

spraying water onto the wafer surfaces to rinse the wafers and, during the spraying of the water, introducing an effective amount of hydrogen chloride gas and ozonized oxygen into the treatment chamber;

rinsing the wafers again by spraying water onto the wafer surfaces;

reintroducing an effective amount of hydrogen fluoride gas into the treatment chamber containing the water mist;

rerinsing the wafers with water;

additionally introducing an effective amount of ozonized oxygen into the treatment chamber containing the water mist, for a predetermined time interval;

each of said chemically active substances chemically acting on said surface of said wafers; and drying the wafers in the treatment chamber.

9. The process as recited in claim 8, wherein said first step of spraying water mist lasts approximately 20 seconds.

10. The process as recited in claim 8, wherein for both steps of introducing hydrogen fluoride, the flow rate of the hydrogen fluoride gas is matched to the flow rate of the water by a suitable molar ratio and the gas is introduced for about 60 seconds.

11. The process as recited in claim 8, wherein the first step of spraying water onto the wafer surfaces to rinse the wafers is for a duration of approximately 100 seconds.

12. The process as recited in claim 8, wherein said step of introducing hydrogen chloride gas and ozonized oxygen occurs for approximately 120 seconds.

13. The process as recited in claim 8, wherein said second step of rinsing the wafers occurs for approximately 180 seconds.

14. The process as recited in claim 8, wherein said step of reintroducing hydrogen fluoride gas occurs for approximately 60 seconds.

15. The process as recited in claim 8, wherein said final step of rerinsing the wafers with water occurs for a duration of 100 seconds.

16. The process as recited in claim 8, wherein said last step of introducing ozonized oxygen onto the water surfaces occurs for a duration of 60 seconds.

17. The process as claimed in claim 8, wherein the water is adjusted to a temperature between 35° C. to 75° C.

18. The process as claimed in claim 8, wherein the water is adjusted to a temperature between 15° C. to 25° C.

* * * * *